US012754237B2

(12) United States Patent
Lin et al.

(10) Patent No.: US 12,754,237 B2
(45) Date of Patent: *Oct. 6, 2026

(54) DATA CORRECTION AND PHASE OPTIMIZATION IN HIGH-SPEED RECEIVERS

(71) Applicant: Diodes Incorporated, Plano, TX (US)

(72) Inventors: Yu-Wei Lin, New Taipei City (TW); Nanyuan Chen, Taipei City (TW)

(73) Assignee: Diodes Incorporated, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/954,895

(22) Filed: Nov. 21, 2024

(65) Prior Publication Data

US 2025/0085345 A1 Mar. 13, 2025

Related U.S. Application Data

(63) Continuation of application No. 17/657,466, filed on Mar. 31, 2022, now Pat. No. 12,181,523.

(51) Int. Cl.

| | |
|---|---|
| ***G01R 31/3185*** | (2006.01) |
| ***G01R 31/317*** | (2006.01) |
| ***H04L 25/03*** | (2006.01) |

(52) U.S. Cl.

CPC ................ *G01R 31/318552* (2013.01); *G01R 31/31727* (2013.01); *H04L 25/03267* (2013.01)

(58) Field of Classification Search

CPC ...... G01R 31/318552; G01R 31/31727; H04L 25/03267; H04L 7/0025; H04L 7/0058; H04L 7/033; H04L 25/03146; H04L 25/03273; H04L 25/03878; H04L 25/03057; H04L 1/0001; H04L 25/0292; H04L 1/0091; H04L 25/0272; G06F 11/07

See application file for complete search history.

(56) References Cited

U.S. PATENT DOCUMENTS

| | | | | |
|---|---|---|---|---|
| 8,160,179 B2 * | 4/2012 | Forey | .................... | H04L 25/085 375/259 |
| 9,215,107 B1 * | 12/2015 | De Bernardinis | .... | H04L 7/0062 |
| 2002/0027963 A1 * | 3/2002 | Imanaka | ................. | H03L 7/091 375/346 |

* cited by examiner

*Primary Examiner* — Jean B Corrielus

(74) *Attorney, Agent, or Firm* — Weaver Austin Villeneuve & Sampson LLP

(57) ABSTRACT

Methods and systems for performing data correction and phase optimization are disclosed herein. In some implementations, a system for performing data correction comprises: an analog to digital converter (ADC) configured to receive differential data from a continuous time linear equalizer (CTLE) and generate a bitstream comprising a plurality of data bits and a corresponding plurality of data sign bits; a decision feedback equalization (DFE) block configured to receive the bitstream from the ADC and provide data to a clock and data recovery (CDR) block; and data correction circuitry. In some implementations, the data correction circuitry is configured to: receive the bitstream from the ADC; determine whether to correct a data sign bit; responsive to determining the data sign bit is to be corrected, flip the data sign bit; and provide the plurality of data sign bits, including the flipped data sign bits, to the DFE.

20 Claims, 6 Drawing Sheets

DATA CORRECTION AND PHASE OPTIMIZATION IN HIGH-SPEED RECEIVERS

INCORPORATION BY REFERENCE

An Application Data Sheet is filed concurrently with this specification as part of this application. Each application to which this application claims benefit or priority as identified in the concurrently filed Application Data Sheet is incorporated by reference herein in its entirety and for all purposes.

BACKGROUND

A Serializer/Deserializer (SerDes) device may receive or capture incoming data at a high speed. This high speed data may then be processed through a high-loss channel. Accordingly, there may be errors or inaccuracies in the received and/or processed data. However, it may be difficult to correct the received data, particularly due to the relatively high speed at which data is transmitted and/or received.

SUMMARY

Methods and systems for performing data correction and phase optimization in high-speed receivers are disclosed herein.

According to certain implementations, a system for performing data correction comprises: an analog to digital converter (ADC) configured to receive differential data from a continuous time linear equalizer (CTLE) and generate, as an output, a bitstream comprising a plurality of data bits and a corresponding plurality of data sign bits; a decision feedback equalization (DFE) block configured to receive the bitstream from the ADC and provide data to a clock and data recovery (CDR) block; and data correction circuitry. The data correction circuitry may be configured to: receive the bitstream from the ADC; determine whether to correct a data sign bit of the plurality of data sign bits; responsive to determining the data sign bit is to be corrected, flip the data sign bit; and provide the plurality of data sign bits, including the flipped data sign bits, to the DFE.

In some examples, to determine whether to correct the data sign bit, the data correction circuitry is configured to identify a pattern in values of the plurality of data bits of the bitstream. In some examples, the pattern in the plurality of data bits comprises an increase and/or a decrease in the values of the plurality of data bits relative to a threshold voltage. In some examples, the pattern comprises identifying more than a predetermined number of successive data sign bits of the plurality of data sign bits having the same value.

In some examples, to determine whether to correct the data sign bit, the data correction circuitry is configured to determine whether a value of a data bit associated with the data sign bit is within a predetermined threshold of a threshold voltage. In some examples, the threshold voltage comprises a middle of a range of values the ADC is configured to output.

According to certain implementations, a method for performing data correction comprises: receiving a bitstream from an analog-to-digital converter (ADC), the bitstream generated as an output by the ADC based on differential data received from a continuous time linear equalizer (CTLE), wherein the bitstream comprises a plurality of data bits and a corresponding plurality of data sign bits; determining whether to correct a data sign bit of the plurality of data sign bits; responsive to determining the data sign bit is to be corrected, flipping the data sign bit; and providing the plurality of data sign bits, including the flipped data sign bits, to a decision feedback equalization (DFE) block, the DFE block configured to provide data to a clock and data recovery (CDR) block.

In some examples, determining whether to correct the data sign bit comprises identifying a pattern in values of the plurality of data bits of the bitstream. In some examples, the pattern in the plurality of data bits comprises an increase and/or a decrease in the values of the plurality of data bits relative to a threshold voltage. identifying the pattern comprises identifying more than a predetermined number of successive data sign bits of the plurality of data sign bits having the same value.

In some examples, determining whether to correct the data sign bit comprises determining whether a value of a data bit associated with the data sign bit is within a predetermined threshold of a threshold voltage.

According to certain implementations, a system for performing phase optimization comprises: an analog to digital converter (ADC) configured to receive differential data from a continuous time linear equalizer (CTLE) and generate, as an output, a bitstream comprising a plurality of data bits and a corresponding plurality of data sign bits; a decision feedback equalization (DFE) block configured to receive the bitstream from the ADC and provide data to a clock and data recovery (CDR) block; and data correction circuitry. The data correction circuitry may be configured to: receive the bitstream from the ADC; determine a current error value associated with the bitstream; determine whether to perform a phase adjustment of the sampling clock based on the current error value; responsive to determining that a phase adjustment is to be performed, determine a phase offset to be applied to the sampling clock; and provide the determined phase offset to the CDR block, wherein providing the determined phase offset to the CDR block causes an edge of the sampling clock to be moved toward alignment with a center of a data bit waveform associated with a data bit of the plurality of data bits.

In some examples, to determine the current error value, the data correction circuitry is configured to determine a number of values of data bits of the plurality of data bits that are within a predetermined range of a threshold voltage.

In some examples, the phase offset is to be applied by the CDR block in connection with the Mueller-Muller technique to adjust the sampling clock.

In some examples, to determine whether to perform the phase adjustment, the data correction circuitry is configured to determine whether the current error value exceeds an error threshold.

In some examples, to determine the phase offset, the data correction circuitry is configured to: determine whether a phase adjustment was previously applied; and responsive to determining that a phase adjustment was not previously applied, set the phase offset to have a value in a first direction.

In some examples, to determine the phase offset, the data correction circuitry is configured to: determine whether a phase adjustment was previously applied; responsive to determining that a phase adjustment was previous applied, compare the current error value to a previous error value associated with the previous phase adjustment to generate comparison; and set the phase offset to have a value and a direction that is based on the comparison. In some examples, responsive to the comparison indicating that the current error value is less than the previous error value, the phase offset is set to have a direction that is the same as a direction associated with the previous phase adjustment. In some examples, responsive to the comparison indicating that the current value is greater than the previous error value, the phase offset is set to have a direction that is opposite a direction associated with the previous phase adjustment.

According to some implementations, a method for performing phase optimization comprises: receiving a bitstream from an analog-to-digital converter (ADC), wherein the ADC generates the bitstream based on differential data received from a continuous time linear equalizer (CTLE), and wherein the bitstream comprises a plurality of data bits and a corresponding plurality of data sign bits; determining a current error value associated with the bitstream; determining whether to perform a phase adjustment of the sampling clock based on the current error value; responsive to determining that a phase adjustment is to be performed, determining a phase offset to be applied to the sampling clock; and providing the determined phase offset to a clock and data recovery (CDR_block, wherein providing the determined phase offset to the CDR block causes an edge of the sampling clock to be moved toward alignment with a center of a data bit waveform associated with a data bit of the plurality of data bits.

In some examples, determining the current error value comprises determining a number of values of data bits of the plurality of data bits that are within a predetermined range of a threshold voltage.

In some examples, determining the phase offset comprises: determining whether a phase adjustment was previously applied; responsive to determining that a phase adjustment was previous applied, comparing the current error value to a previous error value associated with the previous phase adjustment to generate comparison; and setting the phase offset to have a value and a direction that is based on the comparison. In some examples, responsive to the comparison indicating that the current error value is less than the previous error value, the phase offset is set to have a direction that is the same as a direction associated with the previous phase adjustment. In some examples, responsive to the comparison indicating that the current value is greater than the previous error value, the phase offset is set to have a direction that is opposite a direction associated with the previous phase adjustment.

A further understanding of the nature and advantages of various implementations may be realized by reference to the remaining portions of the specification and the drawings.

DETAILED DESCRIPTION

Figure 1:
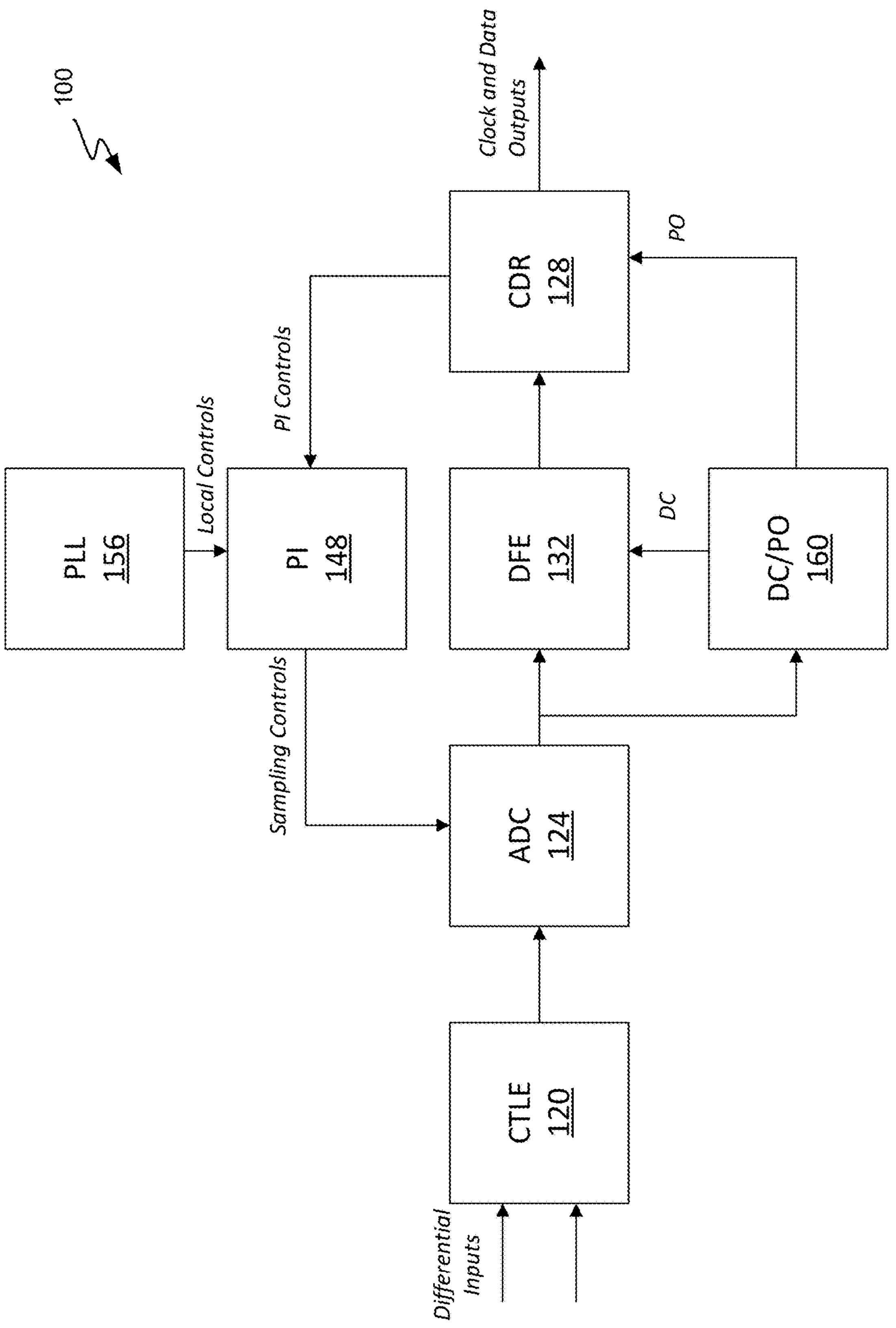
FIG. 1 is a block diagram depicting an example of a receiver device 100 according to some implementations.

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

A Serializer/Deserializer (SerDes) device may receive or capture incoming data at a high speed. This high-speed data may then be processed through a high-loss channel. Accordingly, there may be errors or inaccuracies in the received and/or processed data. However, it may be difficult to correct the received data, particularly due to the relatively high speed at which data is transmitted and/or received.

Described herein are techniques for data correction and phase optimization that may be implemented on a receiver device, e.g., a receiver device of a SerDes system, as shown in and described below in connection with FIG. 1. In some implementations, a data sign bit may be assigned which corresponds to a data bit value. For example, the data sign bit may be assigned as 1 responsive to the data bit value being greater than or equal to a threshold voltage (generally referred to herein as $V_{threshold}$), and may be set as 0 responsive to the data bit value being less than the threshold voltage. Because the data sign bit is utilized to adjust a phase of the sampling clock used by the analog to digital converter (ADC) of the receiver device, accuracy of the data sign bit is important. However, the data sign bit may be inaccurate, particularly in instances in which the data bit value is close to the threshold voltage. Described below (e.g., in connection with FIGS. 2-4) are systems, methods, and techniques for performing data correction on the data sign bit.

In some embodiments, phase optimization may be performed to substantially align a sampling clock edge (e.g., used by the ADC) to a center of a data bit waveform. By aligning the sampling clock edge with the center of the data bit waveform, data bit values close to the threshold voltage (e.g., within a predetermined range of the threshold voltage) may be avoided, thereby improving overall data accuracy. In some embodiments, phase optimization may be performed by determining a phase offset that is used to adjust a phase of the sampling clock. For example, the phase offset may be provided as an offset to the Mueller-Muller technique to adjust the phase of the sampling clock. In some embodiments, the phase offset may be determined as an iterative process that minimizes an error metric, as shown in and described below in connection with FIGS. 5 and 6.

FIG. 1 is a block diagram depicting an example of a receiver device 100. Receiver device 100 is primarily implemented in the digital domain using a combination of circuit components described herein. Receiver device 100 may include a Tx port and a Rx port for connecting with an upstream device or a downstream device (not shown in FIG. 1). The Tx port and/or the Rx port may employ differential signaling; however, single-ended implementations also are possible.

In FIG. 1, a continuous time linear equalizer (CTLE) 120 can be incorporated to process a received signal and equalize frequency dependent loss in the signal, for instance, experienced in a communications channel. An output of CTLE 120 is coupled to an input of an ADC 124, which converts the equalized signal from CTLE 120 to a digital data signal.

For instance, ADC 124 can be implemented as a 5-bit time interleaved ADC. ADC 124 has outputs coupled to pass the digital data signal to an input of CDR 128 via a decision feedback equalizer (DFE) 132. DFE 132 can serve as a nonlinear equalizer, suppressing inter-symbol interference (ISI) due to channel imperfections such as high frequency losses and notches.

In FIG. 1, CDR 128 is of a digital type, in particular, a phase interpolator based CDR, which is configured to communicate with phase interpolators (PIs), as opposed to conventional analog type CDRs, which typically communicate with analog circuitry such as a phase-locked loop (PLL). Receiver device 100 further includes a PI 148, which may include an adjustable current source to update the phase output of a sampling clock provided as an output clock signal to ADC 124. PI 148 may receive PI controls from CDR 128 and outputs of PLL 156.

In FIG. 1, a PLL 156 may be external to receiver device 100 in some implementations but is illustrated as part of receiver device 100 in this example to facilitate understanding. PLL 156 can be implemented as an all-digital PLL (ADPLL) by way of illustration. PLL 156 outputs a base clock signal to both PI 148. The phase control signal delivered from CDR 128 to PI 148 controls the PI 148 to change the phase of the base clock signal. PI 148 generates a respective output clock signal accordingly. PI 148 provides an output clock signal to ADC 124.

In operation, CDR 128 tracks an incoming bit stream of the digital data signal mentioned above and extracts both an embedded clock signal and a data component from the bit stream. In this example, CDR 128 does so by examining phase information from the data sampled by ADC 124 and continuously updating the phase control signal to PI 148. If CDR 128 finds that the sampled data is ahead of the output clock signal provided from PI 148 to ADC 124, CDR 128 updates the phase control signal to correspondingly increase the clock frequency, and vice versa. The target is to align the base clock signal generated by PLL 156 with the embedded clock signal and sample the data at the optimal timing.

In FIG. 1, in this example, ADC 124 can be implemented as a flash 5-bit ADC with 2-bit interpolation, by way of illustration. For instance, ADC 124 can include four time-interleaved ADCs with an input bandwidth higher than 10 GHz. ADC 124's sampling clock can run at 5 GHz with an effective number of bits (ENOB) above 4.5 bits, by way of example. In such an implementation, DFE 132 can receive the four time-interleaved ADCs' output data and process/optimize DFE coefficients accordingly. CDR 128 can apply a technique or process to adjust early/late sampling based on the output clock signal from PI 148.

Internal digital logic, a state machine and/or a microcontroller can be used to control and otherwise manage components of receiver device 100 including CTLE 120, ADC 124, CDR 128, FIFO 140, digital filter 152, and first and second PIs 144 and 148. Internal digital logic, a state machine, and/or a microcontroller also can manage automatic adaptation of CTLE 120 and DFE 132 and implement protocol link training and status updates.

Referring to FIG. 1, ADC 124 may generate data bits, which may be a result of a series of comparators. For example, in an instance in which ADC 124 is a 5-bit ADC, ADC 124 may generate 5 data bits, which may produce values from 0 to 31, as a result of 31 comparators. Based on the data bits generated by ADC 124, a data sign bit indicative of the sign of the data bits with respect to a threshold voltage may be determined Note that the threshold voltage is generally referred to herein as $V_{threshold}$.

Figure 2:
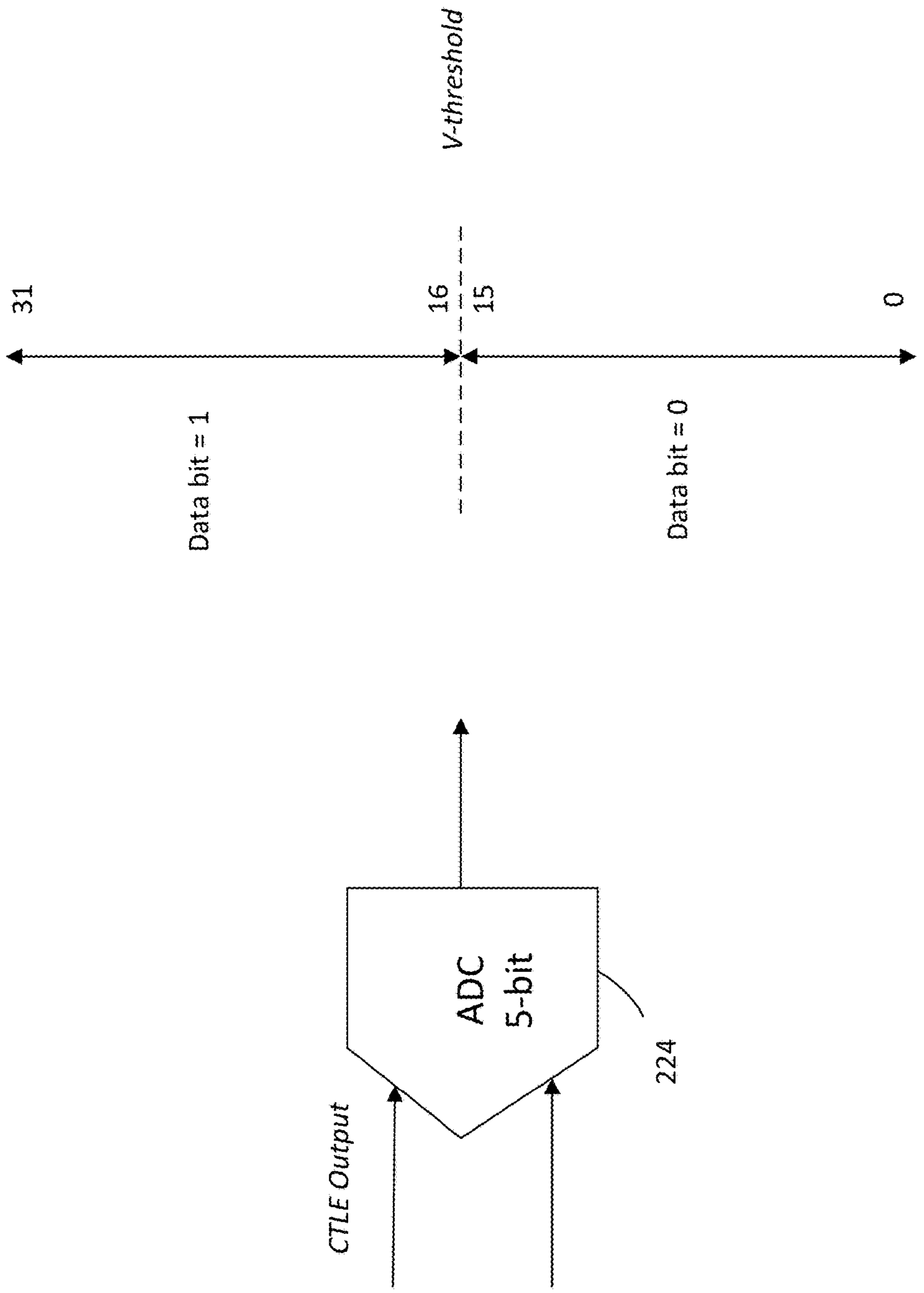
FIG. 2 illustrates an example analog to digital converter (ADC) and data sign bits generated based on ADC output according to some implementations of a digital filter.

FIG. 2 illustrates an example of generation of the data sign bit according to some implementations. For example, FIG. 2 illustrates a 5-bit ADC 224. ADC 224 generates data bits that correspond to a value between 0 and 31. As illustrated in FIG. 2, in an instance in which $V_{threshold}=16$, responsive to the value of the data bits being in a range of 0-15, inclusive, the DFE may set the data sign bit to 0. Conversely, responsive to the value of the data bits being greater than or equal to 16, the DFE may set the data sign bit to 1. Note that the value of $V_{threshold}$ as described herein is merely exemplary, and other values of $V_{threshold}$ are possible.

Referring back to FIG. 1, the data sign bit generated by ADC 124 is utilized by CDR 128 and DFE 132 to generate information used for inter-symbol interference (ISI) compensation and phase control. Data correction and phase optimization block 160 can correct the data sign bit to allow DFE 132 to perform the correct compensation, and to improve the phase alignment performed by CDR 128. More detailed techniques for performing data correction (e.g., as performed by data correction and phase optimization block 160) are shown in and described below in connection with FIGS. 3 and 4).

Moreover, data correction and phase optimization block 160 may provide phase optimization information to CDR 128 to allow CDR 128 to adjust phase compensation information. In particular, as described below in connection with FIGS. 5 and 6, data correction and phase optimization block 160 may provide phase optimization information to CDR 128 that allows the sampling clock to be aligned with the center of the data bit waveform, thereby allowing the data correction techniques described herein to be synchronized with the phase compensation.

In some implementations, a data sign bit may be corrected for corresponding data bits that have a value that is within a predetermined range (e.g., +/−1, +/−2, or the like) of the threshold voltage ($V_{threshold}$). In some embodiments, the data sign bit may be corrected responsive to a determination that corresponding data bits are within a predetermined range and responsive to a determination that a specific pattern (e.g., of a set of candidate patterns) exists for data bits previous to and/or after the data bit within a predetermined range.

Figure 3:
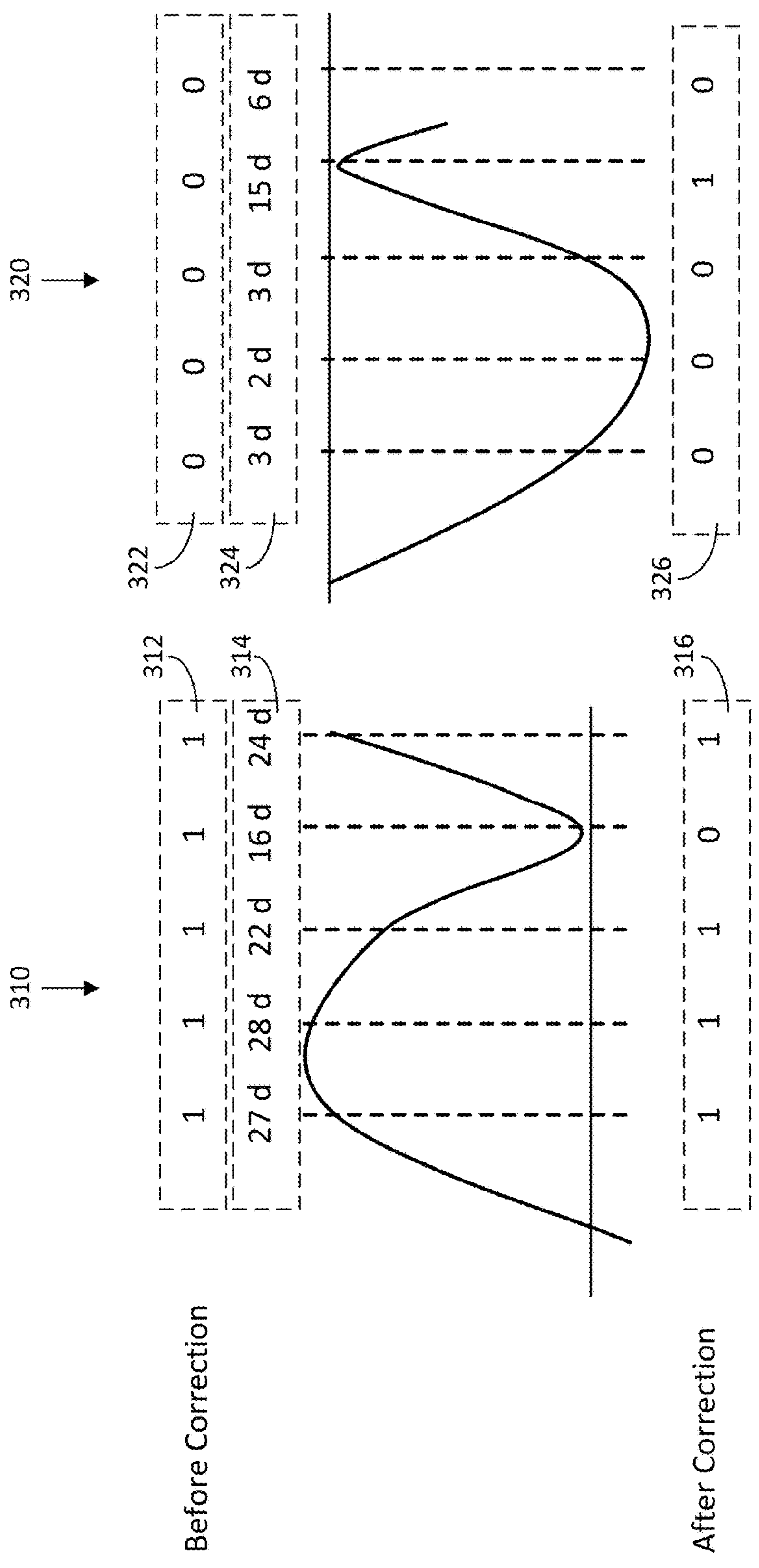
FIG. 3 illustrates an example of data correction according to some implementations.

FIG. 3 illustrates two examples of data sign bits that have been corrected based on corresponding patterns in the data bits, in accordance with some implementations. Referring to a first example 310, a set of data bits 314 is received (e.g., from an ADC). In the example shown in FIG. 3, data bits of set of data bits 314 are within a range of 0 to 31, and $V_{threshold}$ is 16. In example 310, set of data bits 314 have values of 27, 28, 22, 16, and 24. Because the data sign bit is set to 1 if the value of corresponding data bits is greater than or equal to 16 (i.e., $V_{threshold}$), set of pre-correction data sign bits 312 are 1, 1, 1, 1, 1, because all of the values of set of data bits 314 are greater than 16 (i.e., $V_{threshold}$). However, because the fourth value of the data bits of set of data bits 314 (which has a value of 16), may be incorrect due to a lossy channel, the corresponding data sign bit, which is 1 in set of pre-correction data sign bits 312, may also be incorrect. Accordingly, the fourth data sign bit may be corrected (e.g., by data correction and phase optimization block 160 of FIG. 1) to be 0, as shown in corrected data sign bits 316. The fourth data sign bit may be corrected based on the fourth value of data bits being within a predetermined range of $V_{threshold}$, and based on a pattern of values associated with set of data bits 314. For example, note that the values of the data bits in set of data bits decrease over the second, third, and fourth values (i.e., over the values of 28, 22, and 16). In some implementations, a decrease (or, conversely, an increase) over a preceding number (e.g., the preceding two, three, four, etc. data bits) may be a pattern that is identified to cause correction of a data sign bit. As another example, note that the values of data bits in set of data bits 314 are non-monotonic over the second through fifth values. In other words, the fourth data bit value is 16, which is a decrease from the third data bit value of 22, and the fifth data bit value is 24, which is an increase from the fourth data bit value of 16. In some implementations, a non-monotonicity over a predetermined number of data bits (e.g., three data bits, four data bits, five data bits, etc.) without a corresponding change in the data sign bit may be a pattern that is identified to cause correction of a data sign bit.

Referring to a second example 320, a set of data bits 324 are received (e.g., from an ADC), where the set of data bits 324 have values of 3, 2, 3, 15, and 6. Because all of the values associated with set of data bits 324 are less than $V_{threshold}$, set of pre-correction data sign bits 322 have value of 0, 0, 0, 0, and 0. However, in some implementations, the fourth data sign bit may be corrected to have a value of 1 responsive to a determination that the corresponding fourth data bit value (i.e., 15) is within a predetermined range of $V_{threshold}$ (e.g., +/−1, +/−2, etc.). Moreover, note that there is an increase over the second, third, and fourth data bit values (i.e., over the values 2, 3, and 15). As described above, in some implementations, an increase (or, conversely, a decrease) over a preceding number (e.g., the preceding two, three, four, etc. data bits) may be a pattern that is identified to cause correction of a data sign bit. As another example, note that the values of data bits in set of data bits 324 are non-monotonic over the second through fifth values. As described above, in some implementations, a non-monotonicity over a predetermined number of data bits (e.g., three data bits, four data bits, five data bits, etc.) without a corresponding change in the data sign bit may be a pattern that is identified to cause correction of a data sign bit.

Figure 4:
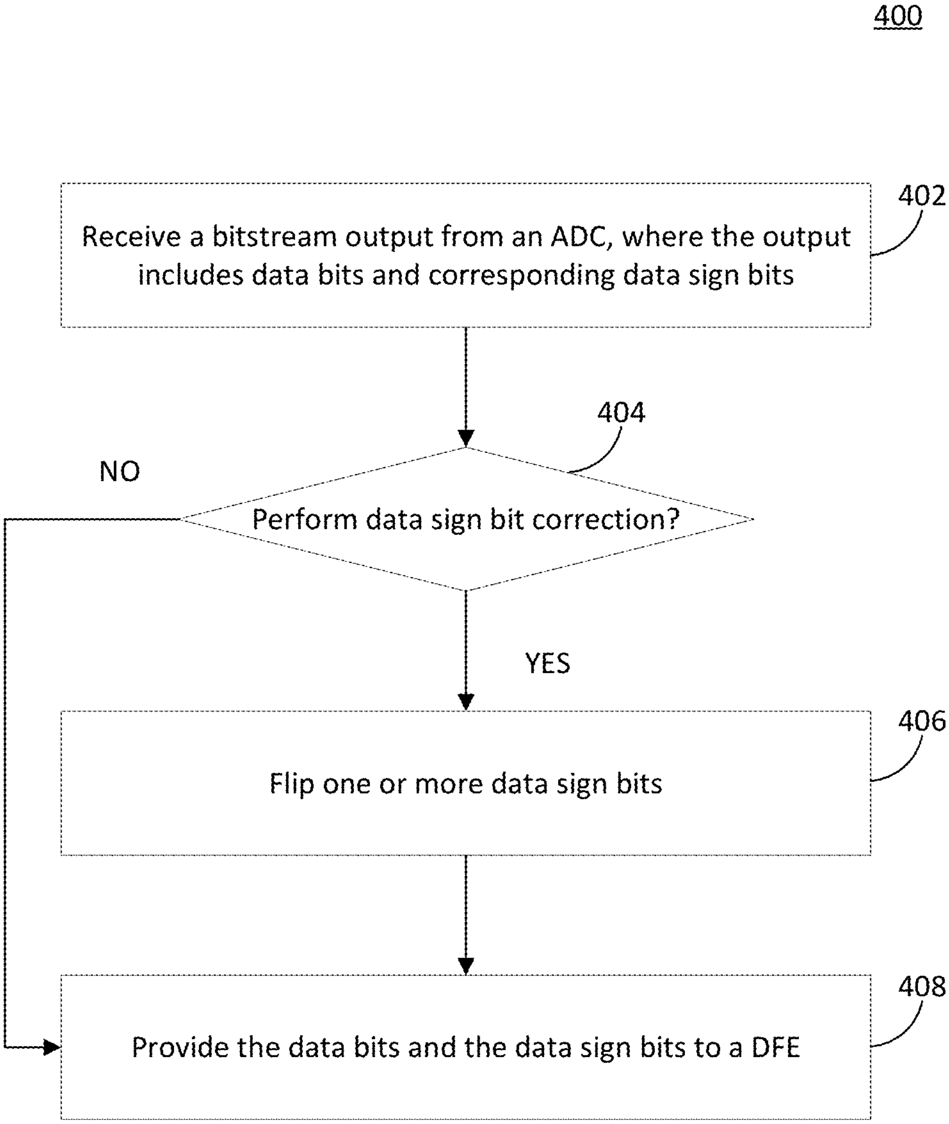
FIG. 4 is a flowchart of an example process for data correction according to some implementations.

Turning to FIG. 4, an example of a process 400 for performing data correction is illustrated in accordance with some embodiments. In some implementations, blocks of process 400 may be executed by a data correction and phase optimization block of a receiver device (e.g., data correction and phase optimization block 160, as shown in and described above in connection with FIG. 1). In some embodiments, blocks of process 400 may be performed in an order other than what is shown in FIG. 4. In some implementations, two or more blocks of process 400 may be performed substantially in parallel. In some implementations, one or more blocks of process 400 may be omitted.

Process 400 can begin at 402 by receiving a bitstream output from an ADC, where the output includes data bits and a data sign bit. The data bits may have a corresponding value determined by the number of bits associated with the ADC. For example, in an instance in which the ADC is a 5-bit ADC, the data bits may have values within a range of 0 to 31. A particular data sign bit may be assigned based on a comparison of a corresponding data bit value with respect to a threshold voltage, $V_{threshold}$. For example, a data sign bit may be set to 0 for a corresponding data value being less than $V_{threshold}$, and may be set to 1 for a corresponding data value being greater than or equal to $V_{threshold}$.

At 404, process 400 can determine whether to perform data sign bit correction on a particular data sign bit included in the bitstream. In some implementations, process 400 can determine that the data sign bit is to be corrected responsive to determining that a corresponding data bit value is within a predetermined range (e.g., within +/−1, within +/−2, or the like) of the threshold voltage $V_{threshold}$. As another example, process 400 can determine that the data sign bit is to be corrected responsive to a particular pattern being identified in the data bit values associated with the bitstream received at block 402. Examples of a particular pattern include an increase or a decrease over a predetermined number of data bit values without a change in a data sign bit value and/or a non-monotonicity over a predetermined number of data bit values within a change in a data sign bit value. In some implementations, process 400 may determine that a particular data sign bit is to be corrected responsive to the data sign bit being within a predetermined range of the threshold voltage and/or one or more patterns being identified in the data bit values of the bitstream.

If, at 404, process 400 determines that none of the data sign bits of the bitstream are to be corrected ("no" at 404), process 400 can proceed to block 408 and can provide the data bits and the data sign bits received from the ADC to a DFE.

Conversely, if, at 404, process 400 determines that one or more of the data sign bits of the bitstream are to be corrected ("yes" at 404), process 400 can proceed to block 406 and can flip the identified one or more data sign bits. For example, in an instance in which, pre-correction, a data sign bit is 0, process 400 may flip the data sign bit to 1, or vice versa. Note that, in some implementations, any suitable number of data sign bits (e.g., one, two, ten, etc.) may be flipped at block 406. Subsequently, process 400 may proceed to block 408 and provide the data bits and the data sign bits, including the corrected data sign bits, to the DFE.

In some implementations, a phase adjustment offset is determined and is provided to a CDR to allow the CDR to perform phase adjustment using the phase adjustment offset. Phase adjustment may be performed to adjust the PI phase to avoid sampling, by the ADC, data bits that are near the threshold voltage. In particular, the phase of the sampling clock used by the ADC may be adjusted such that the clock edge is substantially aligned with a center of the data bit sample. In some embodiments, the CDR performs phase adjustment using the Mueller-Muller technique. In some such embodiments, the phase adjustment offset is an offset that is applied to the Mueller-Muller technique.

Figure 5:
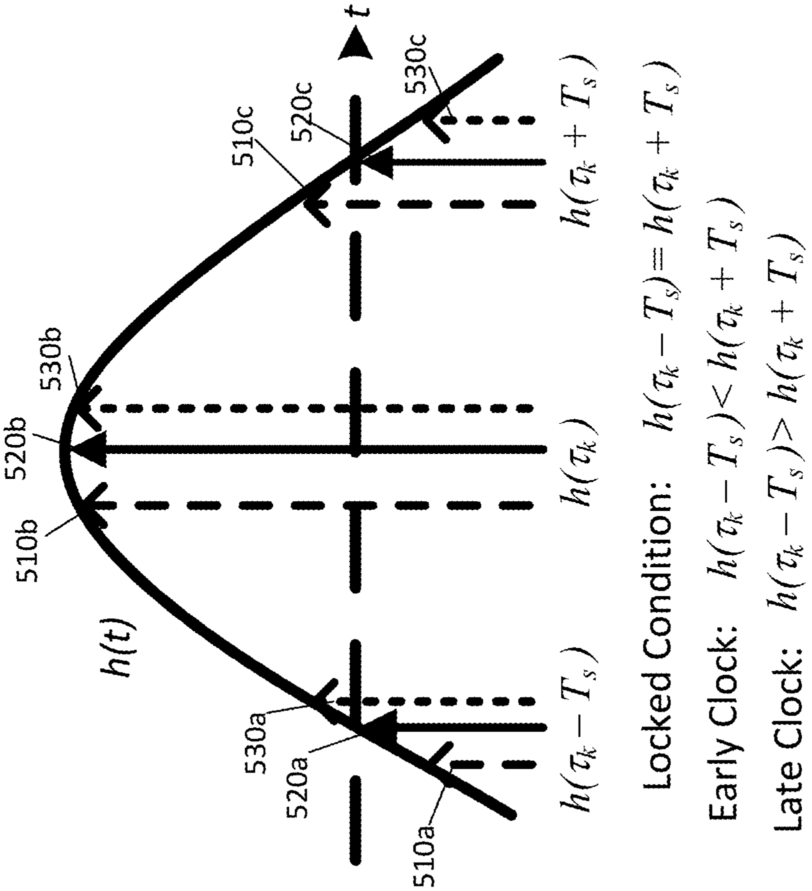
FIG. 5 is a diagram illustrating early and late clocks according to some implementations.

In some embodiments, in an instance in which the sampling clock edge is designated as "early," the phase offset may be negative value such that the phase is increased. Conversely, in an instance in which the sampling clock edge is designated as "late," the phase offset may be a positive value such that the phase is decreased. Applying an offset may help the CDR improve phase alignment for particular data patterns which are poorly aligned when the CDR is initially in a locked condition. FIG. 5 illustrates an example waveform h(t) that is sampled with examples of early, late, and optimal (or "locked") sampling clocks. As illustrated in FIG. 5, h(t) is sampled with a sampling period of $T_s$. The sampled points 510*a* (at time $\tau_k-T_s$) 510*b* (at time $T_s$), and 510*c* (at time $\tau_k+T_s$) correspond to samples obtained using an early sampling clock. The sampled points 520*a* (at time $\tau_k-T_s$) 520*b* (at time $T_s$), and 520*c* (at time $\tau_k+T_s$) correspond to samples obtained using a locked sampling clock The sampled points 530*a* (at time $\tau_k-T_s$) 530*b* (at time $T_s$), and 530*c* (at time $\tau_k+T_s$) correspond to samples obtained using a late sampling clock. As illustrated, in the locked (i.e., optimal) sampling clock case, due to symmetry in the waveform h(t), $h(\tau_k-T_s)=h(\tau_k+T_s)$. In the early sampling clock case, due to the sampling being shifted from the center of the data bit waveform, $h(\tau_k - T_s) < h(\tau_k + T_s)$. In the late sampling clock case, due to the sampling being shifted in an opposite direction from the center of the data bit, $h(\tau_k - T_s) > h(\tau_k + T_s)$.

Because the goal of phase compensation is to shift the sampling clock used by the ADC to be substantially aligned with a center of the data bit waveform (associated with a data pattern which may generate an incorrect data sign bit determination), and therefore, to minimize the number of sampled values that are within a predetermined range of the threshold voltage, a phase offset may be determined by determining, within a bitstream of data values, a number of data values that are within the predetermined range of the threshold voltage. The number of data values that are within the predetermined range of the threshold voltage may be referred to as an error value. A phase offset may then be determined that reduces the error value. In other words, a phase offset may be determined that, when applied to the sampling clock, causes the ADC to sample in a manner that reduces the number of data values within the predetermined range of the threshold voltage. In some embodiments, the phase offset may be iteratively adjusted until a phase offset that minimizes the error value is identified. For example, responsive to determining that an error value exceeds a predetermined error threshold, a phase offset may be applied in a predetermined phase correction direction (e.g., a phase increase, or a phase decrease). Continuing with this example, an updated error value may be determined using the phase offset applied in the predetermined phase correction direction. Responsive to determining that the updated error value is less than the original error value (i.e., that the phase offset applied was in the correct direction), the phase offset may be continued to be applied in the same direction. For example, the phase offset may be further increased (in the case in which the originally applied phase correction was a phase increase), or the phase offset may be further decreased (in the case in which the originally applied phase correction was a phase decrease). Conversely, responsive to determining that the updated error value is greater than the original error value (i.e., that the phase offset applied was in an incorrect direction), a modified phase offset may be applied in an opposite direction to that of the original phase offset. This process may be repeated until the error value is less than the error threshold, thereby allowing the phase of the sampling clock to be iteratively modified until it is substantially aligned with a center of the data bit waveform.

Figure 6:
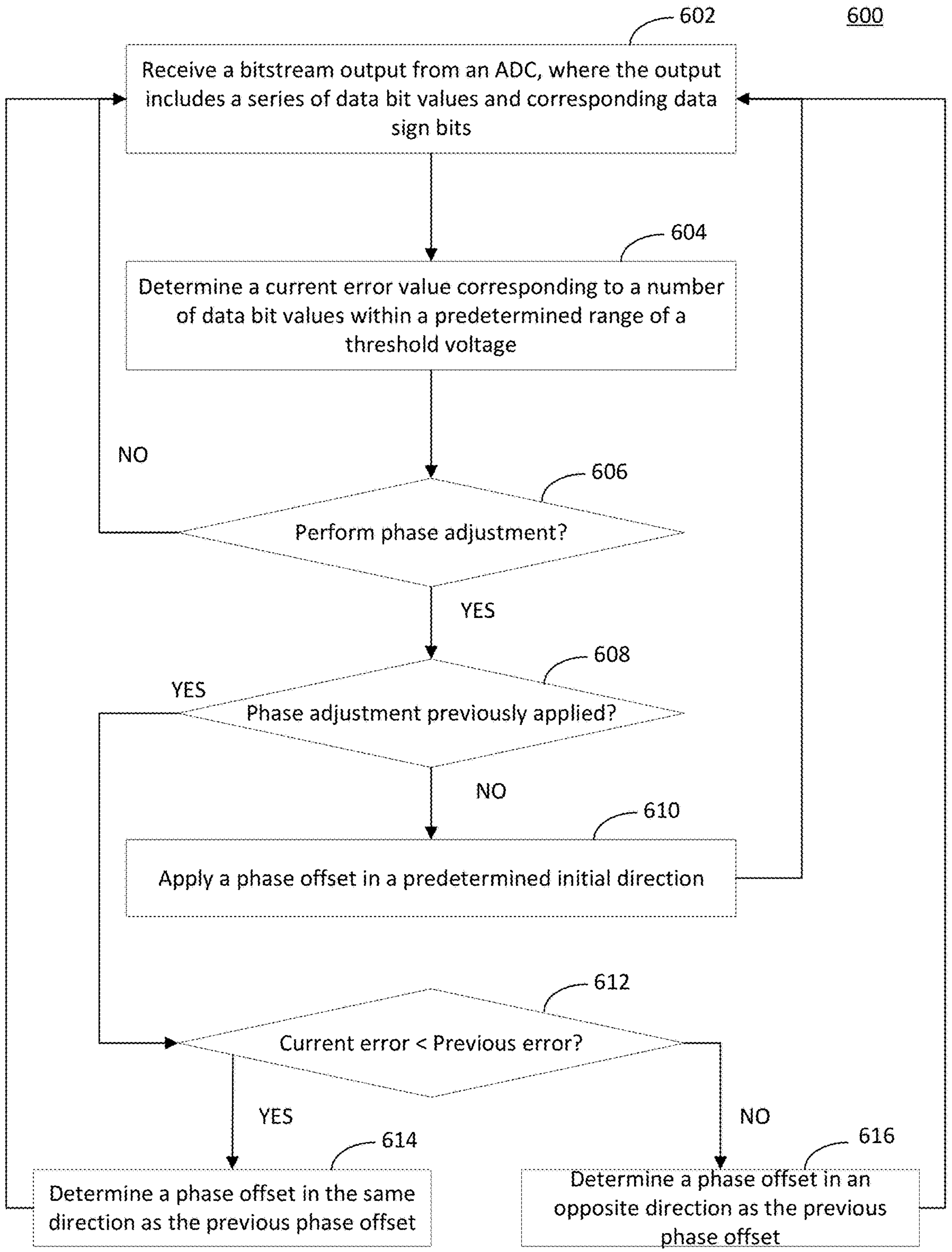
FIG. 6 is a flowchart of an example process for phase optimization according to some implementations.

FIG. 6 shows a flowchart of an example process 600 for determining a phase adjustment offset to be applied to a phase adjustment calculation in order to shift a sampling clock, used by an ADC, toward a center of a data bit waveform in accordance with some embodiments. In some implementations, the phase offset may be applied to a phase adjustment calculation of a Mueller-Muller technique. In some implementations, blocks of process 600 may be executed by a data correction and phase optimization block of a receiver device, such as data correction and phase optimization block 160 of FIG. 1. In some embodiments, blocks of process 600 may be performed in an order other than what is shown in FIG. 6. In some embodiments, two or more blocks of process 600 may be performed substantially in parallel. In some embodiments, one or more blocks of process 600 may be omitted.

Process 600 can begin at 602 by receiving a bitstream output from an ADC, where the output includes a series of data bit values and corresponding data sign bits. Similar to what is described above in connection with FIGS. 1, 2, and 4, the data bit values may be within a range that corresponds to a number of bits associated with the ADC. By way of example, for a 5-bit ADC, the data bit values may be within a range of 0-31. Similar to what is described above in connection with FIGS. 2 and 4, the data sign bit corresponding to a particular data bit value may be set based on a comparison of the data bit value to a threshold voltage ($V_{threshold}$). For example, the data sign bit may be set to 1 responsive to the data bit value being greater than or equal to $V_{threshold}$. Conversely, the data sign bit may be set to 0 responsive to the data bit value being less than $V_{threshold}$.

At 604, process 600 may determine a current error value corresponding to a number of data bit values within a predetermined range of the threshold voltage. The predetermined range may be +/−1 of the threshold voltage, within +/−2 of the threshold voltage, or the like. In some implementations, process 600 can determine the current error value by identifying the number of data bit values received at block 602 that are outside of the predetermined range of the threshold voltage. By way of example, in an instance in which the bitstream includes the data bit values of: 24, 22, 16, 15, 8, 25, 30, and in which the threshold voltage ($V_{threshold}$) is 16 and the predetermined range is +/−2 of the threshold voltage, the current error value may be determined to be 2, because there are two data bit values (i.e., 16 and 15) that are within a range of $V_{threshold}-2$-$V_{threshold}+2$ (i.e., within a range of 14-18).

At 606, process 600 can determine whether to perform phase adjustment. For example, process 600 can determine whether to perform phase adjustment based on the current error value determined at block 604. As a more particular example, process 600 can compare the current error value to an error threshold, and can determine that phase adjustment is to be performed responsive to determining that the current error value meets or exceeds the error threshold. Conversely, process 600 can determine that phase adjustment is not to be performed responsive to determining that the current error value is less than the error threshold. In some embodiments, the error threshold may be a fixed error threshold. In some embodiments, the error threshold may depend on, e.g., parameters associated with the bitstream, such as size, bitrate, etc. The error threshold may be a user-configurable or design specific value.

If, at 606, process 600 determines that phase adjustment is not to be performed ("no" at 606), process 600 can loop back to block 602 and can receive additional bitstream output from the ADC.

Conversely, if, at 606, process 600 determines that phase adjustment is to be performed ("yes" at 606), process 600 can proceed to block 608 and can determine whether phase adjustment was previously performed, e.g., in a previous iteration of process 600. In other words, at block 606, process 600 may determine whether the current iteration, or loop, through process 600 is the first iteration through process 600, or is a subsequent iteration through process 600. In some implementations, process 600 may determine whether phase adjustment is to be performed based on a loop counter that indicates whether the current iteration through process 600 is a first iteration or a subsequent (e.g., second, third, fourth, etc.) iteration through process 600.

If, at block 608, process 600 determines that phase adjustment has not been previously performed ("no" at block 608), process 600 can, at block 610, apply a phase offset in a predetermined initial direction. The predetermined initial direction may be either a phase increase, or a phase decrease. For example, in some implementations, all initial phase offsets may be in a phase increase direction. As another example, in some implementations, all initial phase offsets may be in a phase decrease direction. In some embodiments, process 600 may set the initial phase offset as an initial offset value (e.g., 2, 3, 4, 10, or the like). Process 600 can then loop back to block 602 and receive additional bitstream data.

Conversely, if, at block 608, process 600 determines that phase adjustment has been previously performed ("yes" at block 608), process 600 can determine, at 612, whether the current error value (e.g., as determined at block 604) is less than a previous error value associated with the previously performed phase adjustment.

If, at block 612, process 600 determines that the current error value is less than the previous error value associated with the previously performed phase adjustment, process 600 can determine, at 614, a phase offset that is in the same direction as the previous phase offset. In other words, because the current error value is less than the previous error value associated with the previously performed phase adjustment, the previously performed phase adjustment was in the correct direction. Accordingly, process 600 can determine a phase offset in the same direction as the previously performed phase adjustment. For example, in an instance in which the previously performed phase adjustment corresponds to a phase increase, process 600 can determine the phase offset as also corresponding to a phase increase. Conversely, in an instance in which the previously performed phase adjustment corresponds to a phase decrease, process 600 can determine the phase offset as also corresponding to a phase decrease.

In some embodiments, process 600 may increase a magnitude of the phase offset relative to the previously applied phase offset. For example, in an instance in which the previously applied phase offset was +4 (e.g., corresponding to a phase increase), process 600 can set the phase offset to +6, +8, +10, or any other suitable value.

Conversely, if, at block 612, process 600 determines that the current error value is greater than the previous error value associated with the previously performed phase adjustment, process 600 can determine, at 616 a phase offset that is in the opposite direction as the previous phase offset. In other words, because the current error value is greater than the previous error value associated with the previously performed phase adjustment, the previously performed phase adjustment was in the incorrect direction. Accordingly, process 600 can determine a phase offset in the opposite direction as the previously performed phase adjustment. For example, in an instance in which the previously performed phase adjustment corresponds to a phase increase, process 600 can determine the phase offset as corresponding to a phase decrease. Conversely, in an instance in which the previously performed phase adjustment corresponds to a phase decrease, process 600 can determine the phase offset as corresponding to a phase increase.

In some embodiments, process 600 may increase a magnitude of the phase offset relative to the previously applied phase offset. For example, in an instance in which the previously applied phase offset was +4 (e.g., corresponding to a phase increase), process 600 can set the phase offset to −6, −8, −10, or any other suitable value having an opposite phase adjustment direction. Alternatively, in some embodiments, process 600 may maintain the magnitude of the previously applied phase offset and switch the direction of the phase adjustment. For example, in an instance in which the previously applied phase offset was +4 (e.g., corresponding to a phase increase), process 600 can set the phase offset to −4.

Regardless of whether the phase adjustment direction is maintained (e.g., at block 614) or reversed (e.g., at block 616), process 600 can loop back to block 602 and can receive additional bitstream data. The phase offset can then be applied to the additional bitstream data, and further adjusted based on subsequent iterations of process 500. This process may be repeated until the current error value is less than the error threshold, at which point the sampling clock may be determined to be suitably aligned with a center of the data bit waveform.

It should be noted that a phase offset, whether an initially determined phase offset (e.g., at block 610), a phase offset in the same direction as a previously applied phase offset (e.g., at block 614), or a phase offset in the opposite direction as the previously applied phase offset (e.g., at block 616), may be applied as an offset constant in the Mueller-Muller technique. For example, as described above in connection with FIG. 5, given successive data waveform samples of $h(\tau_k - T_s)$, $h(\tau_k)$, and $h(\tau_k + T_s)$, with a sampling time period of $T_s$, the optimal, or locked, condition is represented as $h(\tau_k - T_s) = h(\tau_k + T_s)$. An early clock condition is represented as $h(\tau_k - T_s) < h(\tau_k + T_s)$, and a late clock condition is represented as $h(\tau_k - T_s) < h(\tau_k + T_s)$. Given:

$$h(\tau_k - T_s) = X_{k-1} * A_k$$

$$h(\tau_k + T_s) = X_k * A_{k-1}$$

Given the above, the early clock condition may be represented as:

$$X_k * A_{k-1} - X_{k-1} * A_k > 0$$

In such instances, a phase offset, represented as α, may be used to shift the early clock condition toward the locked clock condition (i.e., by making the above left-side of the equation closer to 0) by subtracting the phase offset as follows:

$$X_k * A_{k-1} - X_{k-1} * A_k - \alpha$$

Conversely, the late clock condition may be represented as:

$$X_k * A_{k-1} - X_{k-1} * A_k < 0$$

In such instances, the phase offset α may be added as follows, in order to shift the late clock condition toward the locked clock condition (i.e., by making the above left-side of the equality closer to 0):

$$X_k * A_{k-1} - X_{k-1} * A_k + \alpha$$

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A system for performing data correction, comprising:
data correction circuitry configured to:
receive a bitstream from an analog-to-digital converter (ADC), the bitstream comprising a plurality of data bits and a corresponding plurality of data sign bits;
determine whether to correct a data sign bit of the plurality of data sign bits;
responsive to determining the data sign bit of the plurality of data sign bits is to be corrected, flip the data sign bit of the plurality of data sign bits; and
provide the plurality of data sign bits, including the flipped data sign bit, to a decision feedback equalizer (DFE).

2. The system of claim 1, wherein to determine whether to correct the data sign bit of the plurality of data sign bits, the data correction circuitry is configured to identify a pattern in values of the plurality of data bits of the bitstream.

3. The system of claim 2, wherein the pattern in the plurality of data bits comprises an increase and/or a decrease in the values of the plurality of data bits relative to a threshold voltage.

4. The system of claim 2, wherein the pattern comprises identifying more than a predetermined number of successive data sign bits of the plurality of data sign bits having the same value.

5. The system of claim 1, wherein to determine whether to correct the data sign bit of the plurality of data sign bits, the data correction circuitry is configured to determine whether a value of a data bit associated with the data sign bit of the plurality of data sign bits is within a predetermined threshold of a threshold voltage.

6. The system of claim 5, wherein the threshold voltage comprises a middle of a range of values the ADC is configured to output.

7. A method for performing data correction, comprising:
receiving a bitstream from an analog-to-digital converter (ADC), the bitstream comprising a plurality of data bits and a corresponding plurality of data sign bits;
determining whether to correct a data sign bit of the plurality of data sign bits;
responsive to determining the data sign bit of the plurality of data sign bits is to be corrected, flipping the data sign bit of the plurality of data sign bits; and
providing the plurality of data sign bits, including the flipped data sign bit, to a decision feedback equalizer (DFE).

8. The method of claim 7, wherein determining whether to correct the data sign bit of the plurality of data sign bits comprises identifying a pattern in values of the plurality of data bits of the bitstream.

9. The method of claim 8, wherein the pattern in the plurality of data bits comprises an increase and/or a decrease in the values of the plurality of data bits relative to a threshold voltage.

10. The method of claim 8, wherein identifying the pattern comprises identifying more than a predetermined number of successive data sign bits of the plurality of data sign bits having the same value.

11. The method of claim 7, wherein determining whether to correct the data sign bit of the plurality of data sign bits comprises determining whether a value of a data bit associated with the data sign bit of the plurality of data sign bits is within a predetermined threshold of a threshold voltage.

12. A system for performing phase optimization, comprising:
data correction circuitry configured to:
receive a bitstream from an analog-to-digital converter (ADC), the bitstream comprising a plurality of data bits and a corresponding plurality of data sign bits;
determine a current error value associated with the bitstream;
determine whether to perform a phase adjustment of a sampling clock based on the current error value;
responsive to determining that a phase adjustment is to be performed, determine a phase offset to be applied to the sampling clock; and
provide the determined phase offset to a clock and data recovery (CDR) block, wherein providing the determined phase offset to the CDR block causes an edge of the sampling clock to be moved toward alignment with a center of a data bit waveform associated with a data bit of the plurality of data bits.

13. The system of claim 12, wherein to determine the current error value, the data correction circuitry is configured to determine a number of values of data bits of the plurality of data bits that are within a predetermined range of a threshold voltage.

14. The system of claim 12, wherein the phase offset is to be applied by the CDR block in connection with a Mueller-Muller technique to adjust the sampling clock.

15. The system of claim 12, wherein to determine whether to perform the phase adjustment, the data correction circuitry is configured to determine whether the current error value exceeds an error threshold.

16. The system of claim 12, wherein to determine the phase offset, the data correction circuitry is configured to:
determine whether a phase adjustment was previously applied; and
responsive to determining that the phase adjustment was not previously applied, set the phase offset to have a value in a first direction.

17. The system of claim 12, wherein to determine the phase offset, the data correction circuitry is configured to:
determine whether a phase adjustment was previously applied;
responsive to determining that the phase adjustment was previous applied, compare the current error value to a previous error value associated with the previous phase adjustment to generate a comparison; and
set the phase offset to have a value and a direction that is based on the comparison.

18. The system of claim 17, wherein responsive to the comparison indicating that the current error value is less than the previous error value, the phase offset is set to have a direction that is the same as a direction associated with the previous phase adjustment.

19. The system of claim 17, wherein responsive to the comparison indicating that the current value is greater than the previous error value, the phase offset is set to have a direction that is opposite a direction associated with the previous phase adjustment.

20. A method for performing phase optimization, comprising:
receiving a bitstream from an analog-to-digital converter (ADC), the bitstream comprising a plurality of data bits and a corresponding plurality of data sign bits;
determining a current error value associated with the bitstream;

determining whether to perform a phase adjustment of a sampling clock based on the current error value;

responsive to determining that a phase adjustment is to be performed, determining a phase offset to be applied to the sampling clock; and providing the determined phase offset to a clock and data recovery (CDR) block, wherein providing the determined phase offset to the CDR block causes an edge of the sampling clock to be moved toward alignment with a center of a data bit waveform associated with a data bit of the plurality of data bits.

* * * * *